(12) United States Patent
Sweegers et al.

(10) Patent No.: US 10,629,788 B2
(45) Date of Patent: Apr. 21, 2020

(54) LIGHT SOURCE

(71) Applicant: KONINKLIJKE PHILIPS N.V., Eindhoven (NL)

(72) Inventors: Norbertus Antonius Maria Sweegers, Aachen (DE); Marc Andre de Samber, Aachen (DE); Hugo Johan Cornelissen, Aachen (DE); Floris Maria Hermansz Crompvoets, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/561,442

(22) PCT Filed: Mar. 17, 2016

(86) PCT No.: PCT/EP2016/055784
§ 371 (c)(1),
(2) Date: Sep. 25, 2017

(87) PCT Pub. No.: WO2016/150807
PCT Pub. Date: Sep. 29, 2016

(65) Prior Publication Data
US 2018/0123003 A1   May 3, 2018

(30) Foreign Application Priority Data

Mar. 26, 2015  (EP) ..................................... 15160940

(51) Int. Cl.
*H01L 33/60* (2010.01)
*H01L 33/58* (2010.01)
(Continued)

(52) U.S. Cl.
CPC .............. *H01L 33/60* (2013.01); *H01L 33/58* (2013.01); *F21Y 2105/10* (2016.08); *F21Y 2115/10* (2016.08); *H01L 33/54* (2013.01)

(58) Field of Classification Search
CPC ......... F21V 13/04; H01L 33/54; H01L 33/60; H01L 33/58
See application file for complete search history.

(56) References Cited

U.S. PATENT DOCUMENTS

| 9,109,774 | B1 * | 8/2015 | Winters ................... F21V 5/007 |
| 2004/0149998 | A1 * | 8/2004 | Henson ................ B60Q 1/0011 257/98 |

(Continued)

FOREIGN PATENT DOCUMENTS

| JP | H05190910 A | 7/1993 |
| JP | 2007513378 A | 5/2007 |

(Continued)

OTHER PUBLICATIONS

EPO as ISA, "International Search Report and Written Opinion" dated May 18, 2016 from International Application No. PCT/EP2016/055784, filed Mar. 17, 2016, 14 pages.

(Continued)

*Primary Examiner* — Zheng Song

(57) ABSTRACT

Proposed is a light source comprising: a plurality of LED light sources, each of the plurality of LED light sources having: a semiconductor diode structure adapted to generate light; and a light output section above the semiconductor diode structure adapted to output light from the semiconductor diode structure, the area of the light output section being less than the area of the semiconductor diode structure; and an optically transmissive structure overlapping the light output sections of the plurality of LED light sources so as to receive light from the light output sections of the plurality of LED light sources and having a light exit section (Continued)

adapted to output the received light. The area of the light exit section of the optically transmissive structure is less than the footprint area of the plurality of LED light sources.

18 Claims, 5 Drawing Sheets

(51) Int. Cl.
 *H01L 33/54* (2010.01)
 *F21Y 115/10* (2016.01)
 *F21Y 105/10* (2016.01)

(56) References Cited

U.S. PATENT DOCUMENTS

| | | |
|---|---|---|
| 2004/0232812 A1 | 11/2004 | Beeson et al. |
| 2004/0246605 A1* | 12/2004 | Stiles ................... F24S 23/79 359/857 |
| 2005/0219476 A1* | 10/2005 | Beeson ................ G03B 21/28 353/98 |
| 2005/0276553 A1 | 12/2005 | Kazakevich |
| 2006/0091411 A1 | 5/2006 | Ouderkirk et al. |
| 2008/0062686 A1* | 3/2008 | Hoelen ................. G02B 6/002 362/240 |
| 2010/0027257 A1* | 2/2010 | Boonekamp .......... F21V 7/0091 362/235 |
| 2010/0046217 A1* | 2/2010 | Ngai ..................... F21S 8/086 362/235 |
| 2011/0025190 A1* | 2/2011 | Jagt ...................... H01L 33/58 313/499 |
| 2011/0198655 A1* | 8/2011 | De Graaf ............... H01L 33/60 257/98 |
| 2013/0229800 A1* | 9/2013 | Park ..................... G02B 5/1876 362/235 |
| 2014/0225147 A1* | 8/2014 | Halbritter ............. H01L 33/58 257/98 |
| 2014/0256071 A1* | 9/2014 | Park ..................... H01L 33/46 438/27 |

FOREIGN PATENT DOCUMENTS

| | | |
|---|---|---|
| JP | 2011515846 A | 5/2011 |
| WO | 2007146860 A1 | 12/2007 |

OTHER PUBLICATIONS

Extended European Search Report dated Sep. 10, 2015 from European Patent Application No. 15160940.1 filed Mar. 26, 2015, 8 pages.
First Office Action dated Dec. 3, 2018, China Patent Application No. 201680018704.9, 20 pages.
Second Office Action dated Jul. 1, 2019, Chinese Patent Application No. 201680018704.9, 18 pages.
CN 201680018704.9, "3rd Office Action," dated Jan. 19, 2020, 12 pages.
JP 2017-550214, "First Office Action," dated Jan. 29, 2020, 8 pages.

* cited by examiner

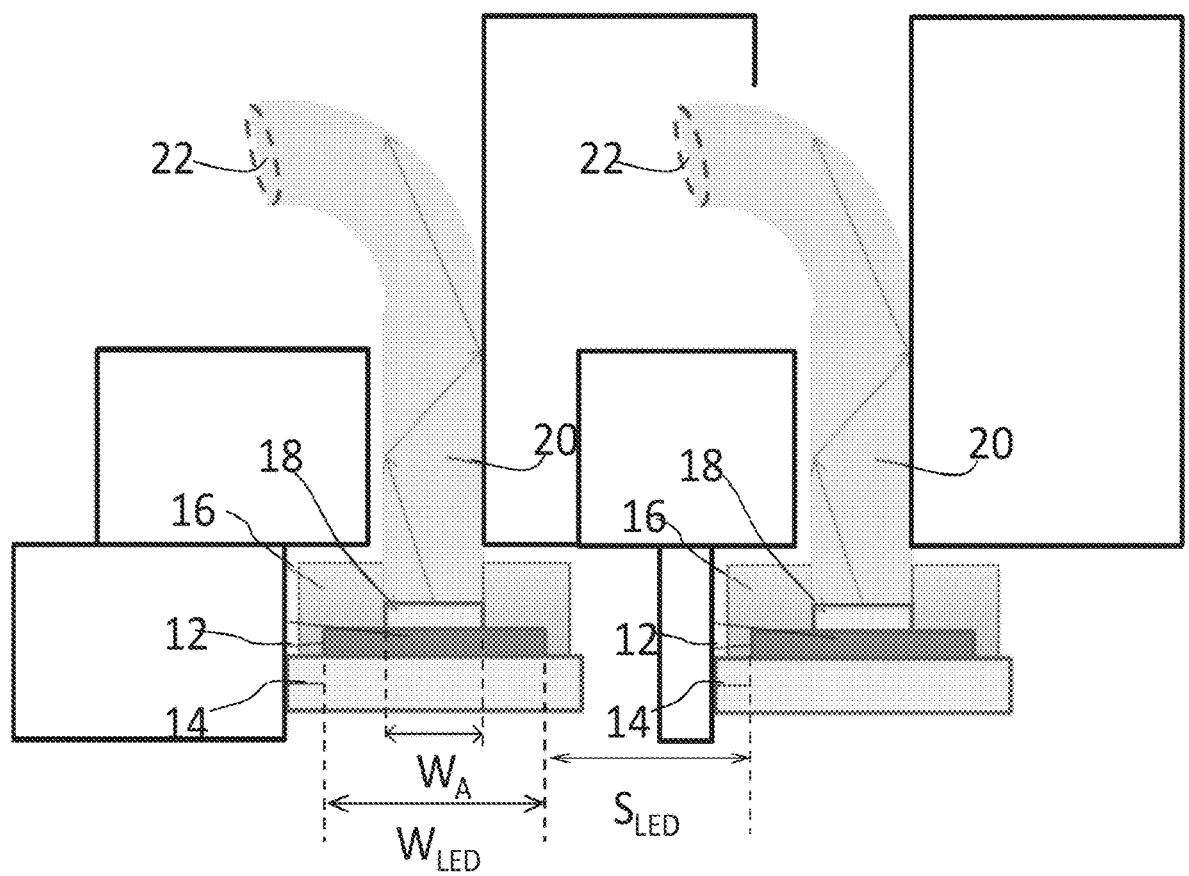
FIG. 2A
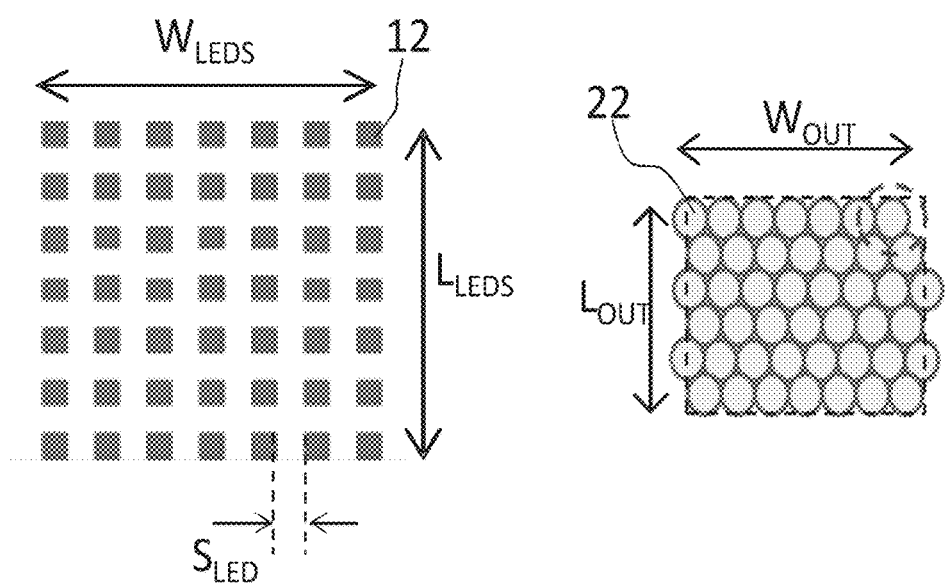
FIG. 2B
FIG. 2C

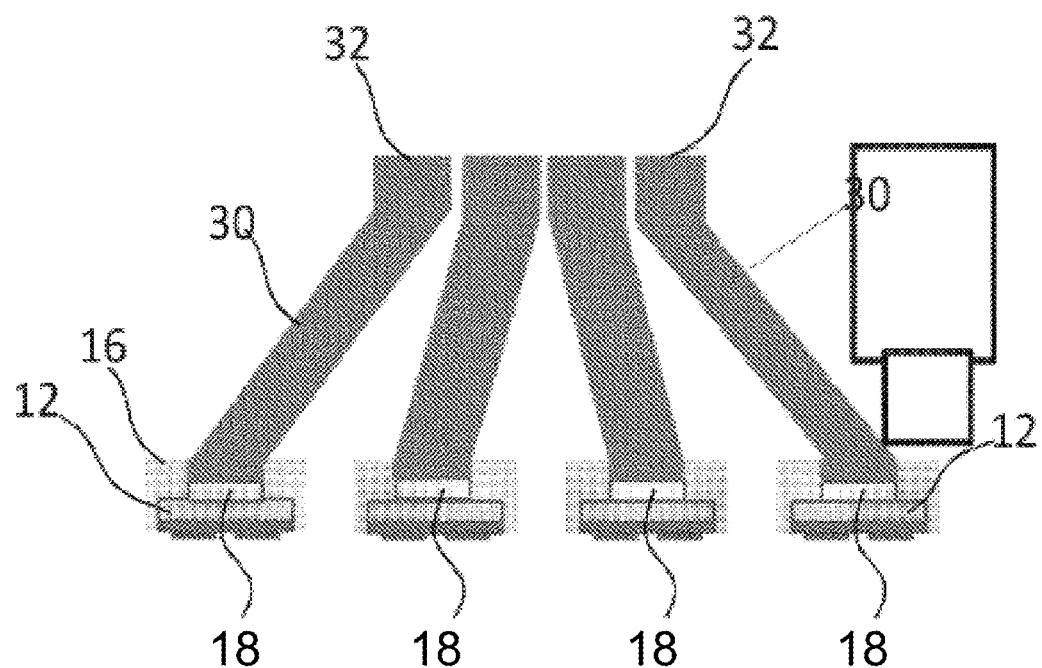
FIG. 3A
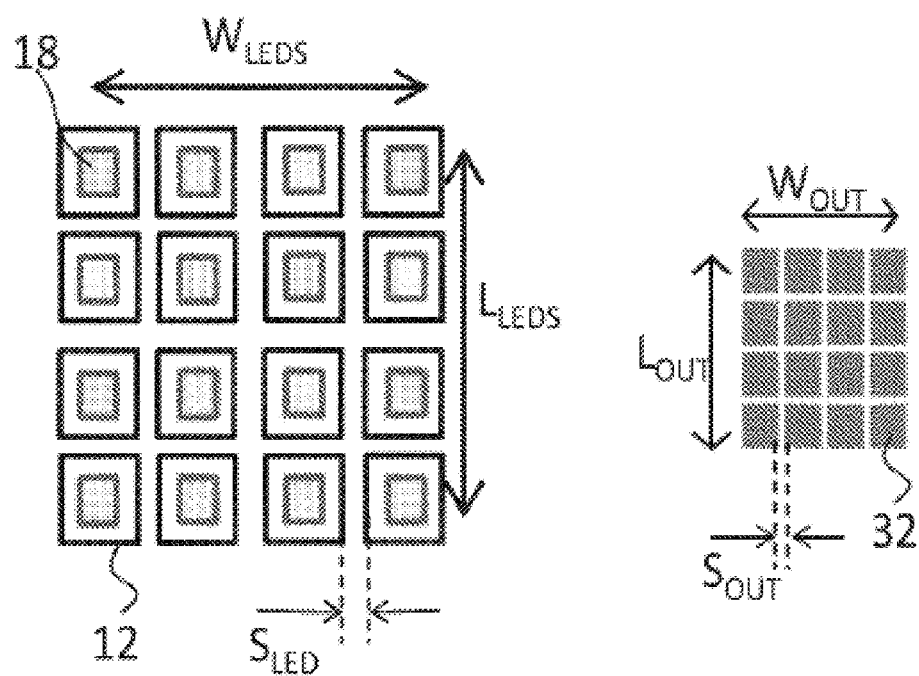 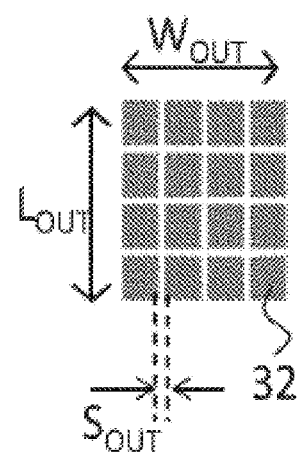
FIG. 3B              FIG. 3C

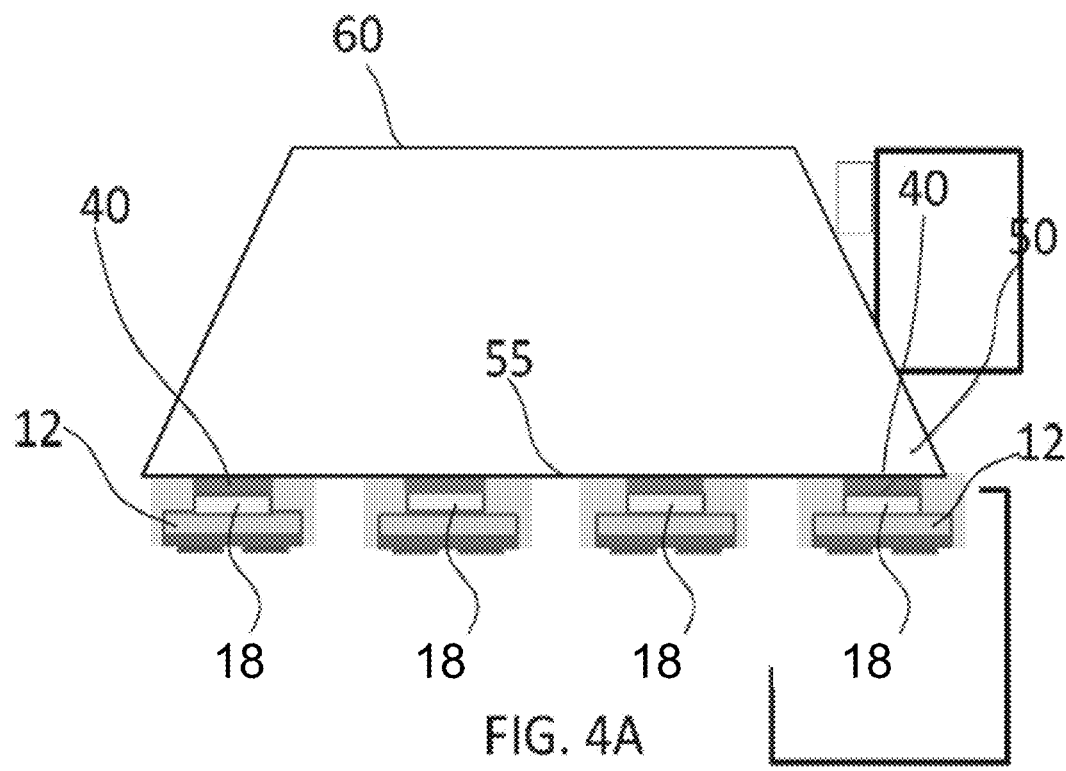
FIG. 4A
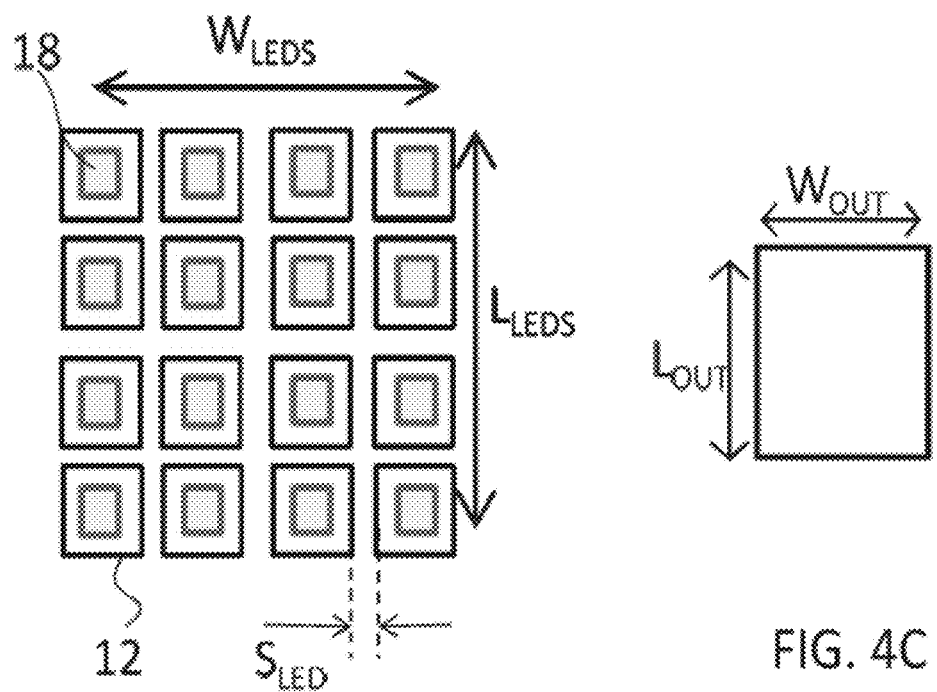
FIG. 4B
FIG. 4C

LIGHT SOURCE

CROSS-REFERENCE TO RELATED APPLICATIONS

The present application is a § 371 application of International Application No. PCT/EP2016/055784 filed on Mar. 17, 2016 and titled "LIGHT SOURCE," which claims the benefit of European Patent Application No. 15160940.1 filed on Mar. 26, 2015. International Application No. PCT/EP2016/055784 and European Patent Application No. 15160940.1 are incorporated herein.

FIELD OF THE INVENTION

This invention relates to a light source, and more particularly to a light source comprising a plurality of semiconductor light sources.

BACKGROUND OF THE INVENTION

Semiconductor light sources, such as light emitting diodes (LEDs), high power LEDs, organic LEDs (OLEDs) and laser diodes are known to be energy efficient and small light sources that have a small/low etendue (i.e. the product of emitting area with solid angle in which the light is emitted). This implies that these semiconductor light sources emit light from a relatively small area into a limited angular range.

Such semiconductor light sources may therefore be beneficial for applications where a bright light source is needed. Typical example applications include projection systems, automotive lighting, camera flashlights, and spot lights. For these examples, improved miniaturization is often desirable. However, merely reducing the size of a semiconductor light source reduces the generated light flux.

It is known to obtain increased luminance from a semiconductor light source by means of a mix box with a small aperture (i.e. light output section) from which the light can escape. FIGS. 1A and 1B illustrate a known LED-based light source 10 employing this concept, wherein light generated by a LED 12 (on a die substrate 14) is recycled/reflected in a mix box (formed from material 16 having high reflectivity) until it escapes via a small aperture 18. By the aperture 18 being "small" it is simply meant as being smaller than the LED 12 such that the aperture area $A_A$ (i.e. width $W_A \times L_A$) is less than the LED area $A_{LED}$ (i.e. width $W_{LED} \times L_{LED}$) of the LED 12.

It is also known to form the aperture 18 from a luminous ceramic material or other phosphorescent material.

SUMMARY OF THE INVENTION

The invention is defined by the claims.

According to an aspect of the invention there is provided a light source comprising: a plurality of LED light sources arranged in a 2-dimensional array, each of the plurality of LED light sources having: a semiconductor diode structure adapted to generate light; and a light output section above the semiconductor diode structure adapted to output light from the semiconductor diode structure, the area of the light output section being less than the area of the semiconductor diode structure; and an optically transmissive structure overlapping the light output sections of the plurality of LED light sources so as to receive light from the light output sections of the plurality of LED light sources and having a light exit section adapted to output the received light, wherein the area of the light exit section of the optically transmissive structure is less than the footprint area of the plurality of LED light sources.

There is proposed the concept of obtaining light of increased luminance from semiconductor light sources having a mix box with a small light output section and then re-emitting the light via a secondary light emitting/exit surface of an optical structure. The optical structure can be used to confine the light output from the semiconductor light sources and emit light via a more concentrated (e.g. smaller) area compared to the area taken up by the semiconductor light sources.

Embodiments may therefore avoid the need to closely pack/space LED light sources, thereby reducing issues related to thermal management of closely packed LED light sources. Also, enabling the LED light sources to be spaced apart (whilst maintaining a small light emitting surface of the light source) may help to relieve addressability limitations related to current density in the conductive addressing tracks.

Thus, there is proposed a concept for employing high luminance LED light sources that have light output sections which are of lesser area than the light generating portions of the light sources. By arranging an optical structure to collect and confine light from the LED light sources and then re-emit the light via a secondary light emitting surface, a pixelated light source may be realised wherein the light emitting surface comprises closely packed pixels which output light from respective LED light sources that are spaced apart (e.g. less closely packed) so that they take up a footprint area that is greater than the area of the light emitting surface. A pixelated light source with high luminance properties and small spacing between the light emitting pixels may therefore be realised using LED light sources that are relieved from the constraint of having to be closely packed with near zero spacing therebetween. The LED light sources may instead comprise power LEDs with high lumen output which are spaced apart so as to be individually addressable and minimise thermal management issues.

The optical structure can be used to provide a saving/reduction in the footprint size of the light exit/emitting surface of the light source. Further, it can be used to enable an increase in the size of the footprint of the LED light sources, thus enabling the use of more powerful LEDs and greater spacing between the LEDs.

In other words, embodiments may provide a high-luminance light source comprising a plurality of high-luminance LED light sources that output light into an optical element which confines the light and then outputs it via a light exit/emitting surface of smaller area than the footprint area of the LED light sources. The optical element can be adapted to redirect the light from the LED light sources so that the light output direction/orientation and/or position is changed or designed to enable tiling such that edges of multiple light exit/emitting surfaces can be closely aligned.

Reference to the "footprint" or footprint area" is to be understood as the shape and size of the area occupied. For example, the footprint of a plurality of LED light sources is to be understood as the total surface/planar space or area occupied by the plurality of LED light sources. Thus, if the LED light sources are spaced apart from each other, the footprint of the LED light sources will comprise the entire area encompassing the LED light sources and the spaces therebetween.

An additional advantage of the optically transmissive structure, besides reducing footprint, is that it allows for re-shaping the original light distribution. For instance, a 4×4 LED array could be transformed in a 2×8 array of light emitting surfaces (or any other arbitrary shape).

The LED light sources of the present disclosure may be any type of LED, such as a Flip Chip type (Thin Film Flip Chip), Patterned Sapphire Substrate, top connected/top emission, top-bottom connected. Also, the light source could be used as naked die, or packaged.

A light output section (or light emission area) of an LED light source refers to an area towards or through which light from the LED is output (or emitted). A cavity or cavities of a LED light source may thus extend towards the light output section. The light output section may for example be an area of the growth substrate, such as sapphire. Also, the light output direction is generalised to be in a single direction (e.g. vertical in the Figures) along which light is output from the light output section. However, it will be understood that not all light output from a light output section may be output exactly along the output direction. Thus, the light output direction should be understood to refer to the general direction along which light is output from a light output section, extending away from the surface of the light output section for example.

In an embodiment, the optically transmissive structure may be adapted to confine received light by total internal reflection and thus reflect received light towards the light exit section. For example, the optically transmissive structure may comprise one or more optical collimators In another embodiment, the optically transmissive structure may comprise a plurality of optical fibres positioned on top of the light output sections of the plurality of LED light sources. By employing an array of optical fibres positioned on the light output sections of the LED light sources, for example, light from the LED light sources can be transmitted along the optical fibres and output from the optical fibres closer to a desired light exit plane and/or position.

The light output sections may be arranged such that there is substantially zero separation between adjacent edges of the light output sections. In practice, however, it may be difficult to perfectly align adjacent edges to have zero lateral separation. Thus, in embodiments, light output sections may be laterally separated by a negligible or small amount. For example, there may be a lateral separation between the adjacent edges of the light output sections of two LED light sources, and this lateral separation may be less than 10% of the lateral width of the light output sections. In embodiments, it may be preferable to reduce such separation to a minimum value (e.g. less than 5% of the lateral width of the light output sections, and even more preferably less than 1% of the lateral width of the light output sections).

In an embodiment, a LED light source may further comprise a light reflecting structure at least partially enclosing side surfaces of the semiconductor diode structure and adapted to reflect light from the semiconductor diode structure towards the light output section. Furthermore, the light output section of the LED light source having a light reflecting structure may comprise an aperture formed in the light reflecting structure. Also, the semiconductor diode structure of the LED light source having an aperture formed in the light reflecting structure may comprise an optical enhancement material.

In an embodiment, the light output section of at least one of the first and second LED light sources may comprise an optical enhancement material. An optical enhancement material may be a 'colour conversion fill', such as a luminous ceramic material or phosphorescent material. This may further help to maintain the etendue of the lateral emission area.

In an embodiment, the light source may further comprise a layer of optical enhancement material at least partially covering the light exit section of the optically transmissive structure.

The optically transmissive structure may further comprise a Fresnel structure at least partially overlapping the light output sections of the plurality of LED light sources.

Further, if an embodiment comprises a plurality of cavities, some or all of the cavities may comprise (e.g. be filled with) different materials. As an example, certain cavities may be filled with a first type of phosphor (e.g. converting blue to white) and other cavities may be filled with another type of phosphor (e.g. converting blue to red).

Embodiments may be employed in the field of automotive lighting and other fields/applications where high-luminance lighting is desirable.

Thus, according to an aspect of the invention, there may be provided an automotive light comprising a light source according to an embodiment.

According to another aspect of the invention, there may be provided a projector light comprising a light source according to an embodiment.

According to yet another aspect of the invention, there is provided a method of manufacturing a light source comprising a plurality of LED light sources arranged in a 2-dimensional array, each of the plurality of LED light sources having: a semiconductor diode structure adapted to generate light; and a light output section above the semiconductor diode structure adapted to output light from the semiconductor diode structure, the area of the light output section being less than the area of the semiconductor diode structure, the method comprising the step of: providing an optically transmissive structure overlapping the light output sections of the plurality of LED light sources so as to receive light from the light output sections of the plurality of LED light sources, the optically transmissive structure having a light exit section adapted to output the received light, wherein the area of the light exit section of the optically transmissive structure is less than the footprint area of the plurality of LED light sources.

The optically transmissive structure may be adapted to confine received light by total internal reflection and thus reflect received light towards the light exit section.

The step of providing the optically transmissive structure comprises positioning a plurality of optical fibres on top of the light output sections of the plurality of LED light sources.

BRIEF DESCRIPTION OF THE DRAWINGS

Examples of the invention will now be described in detail with reference to the accompanying drawings, in which:

FIG. 2A is a side elevation of two LED-based light sources of a light source according to an embodiment, wherein the LED-based light sources are arranged in a spaced apart arrangement.

FIG. 2B depicts the arrangement of the LED-light sources of FIG. 2A when viewed from above (i.e. in plan view);

FIG. 2C depicts the light exit sections of the optically transmissive structure of FIG. 2A, wherein the optically transmissive structure comprises a plurality of optical fibres, and wherein the light exit sections of the optical fibres are closely packed;

FIG. 3A is a side elevation of four LED-based light sources of a light source according to another embodiment, wherein the LED-based light sources are arranged in a spaced apart arrangement;

FIG. 3B depicts the arrangement of the LED-light sources of FIG. 3A when viewed from above (i.e. in plan view);

FIG. 3C depicts the light exit sections of the optically transmissive structure of FIG. 3A, wherein the optically transmissive structure comprises a plurality of optical collimators, and wherein the light exit sections of the optical collimators are closely packed together;

FIG. 4A is a side elevation of four LED-based light sources of a light source according to another embodiment, wherein the LED-based light sources are arranged in a spaced apart arrangement;

FIG. 4B depicts the arrangement of the LED-light sources of FIG. 4A when viewed from above (i.e. in plan view);

FIG. 4C depicts the light exit section of the optically transmissive structure of FIG. 4A, wherein the optically transmissive structure comprises a trapezium-shaped light guide;

DETAILED DESCRIPTION OF THE EMBODIMENTS

Figure 1A:
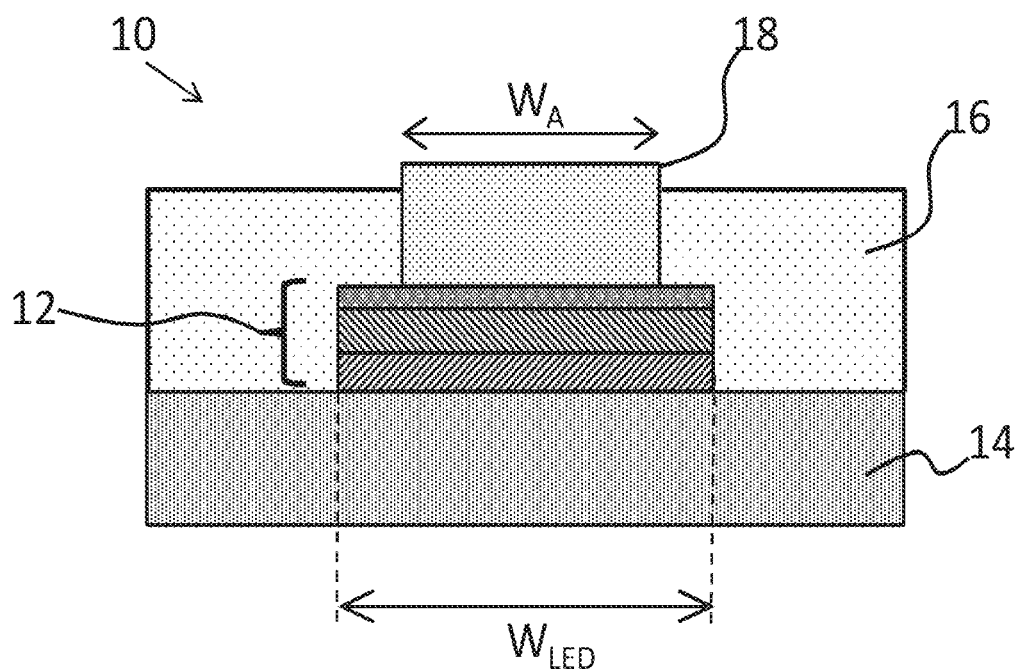
FIG. 1A is a cross-sectional view of a known LED light source.

The invention provides a light source comprising a plurality of LED light sources and a method for manufacturing the same. Embodiments may be of particular relevance to applications that require light of high or increased luminance from a relatively small and/or efficient light source.

Embodiments employ the concept of obtaining light of increased luminance from semiconductor light sources having a mix box with a small light output section and then re-emitting the light via a secondary light emitting/exit surface of an optical structure. By adapting the optical structure to emit light via a more concentrated (e.g. smaller) area compared to the area taken up by the semiconductor light sources, embodiments may avoid the need to closely pack/space semiconductor light sources. Also, enabling the semiconductor light sources to be spaced apart (whilst maintaining a small light emitting surface of the light source) may help to relieve addressability limitations related to current density in the conductive addressing tracks.

Thus, there is proposed an application for high luminance LED light sources that have light output sections which are of lesser area than the light generating portions of the light sources. By arranging an optically transmissive structure (also referred to as an "optical structure") to collect and confine light from the high luminance LED light sources and then re-emit the light via a secondary light emitting surface, a pixelated light source may be realised wherein the light emitting surface comprises closely packed pixels which output light from respective LED light sources. By spacing apart (e.g. less closely packing) the LED light sources so that they take up a footprint area that is greater than the area of the secondary light emitting surface, a pixelated light source with high luminance properties and small spacing between the light emitting pixels may be realised with LED light sources that are relieved from the constraint of having to be closely packed with near zero spacing therebetween.

The term vertical, as used herein, means substantially orthogonal to the surface of a substrate. The term lateral, as used herein, means substantially parallel to the surface of a substrate. Also, terms describing positioning or locations (such as above, below, top, bottom, etc.) are to be construed in conjunction with the orientation of the structures illustrated in the diagrams.

The diagrams are purely schematic and it should therefore be understood that the dimensions of features are not drawn to scale. Accordingly, the illustrated thickness of any of the layers should not be taken as limiting. For example, a first layer drawn as being thicker than a second layer may, in practice, be thinner than the second layer.

FIG. 2 depicts a light source according to an embodiment of the invention. More specifically, FIG. 2A is a side elevation of two LED-based light sources of the light source, wherein the LED-based light sources are arranged in a spaced apart arrangement. FIG. 2B depicts the arrangement of the LED-light sources when viewed from above (i.e. in plan view). FIG. 2C depicts the light exit sections of the optically transmissive structure, wherein the optically transmissive structure comprises a plurality of optical fibres, and wherein the light exit sections of the optical fibres are closely packed.

Figure 1B:
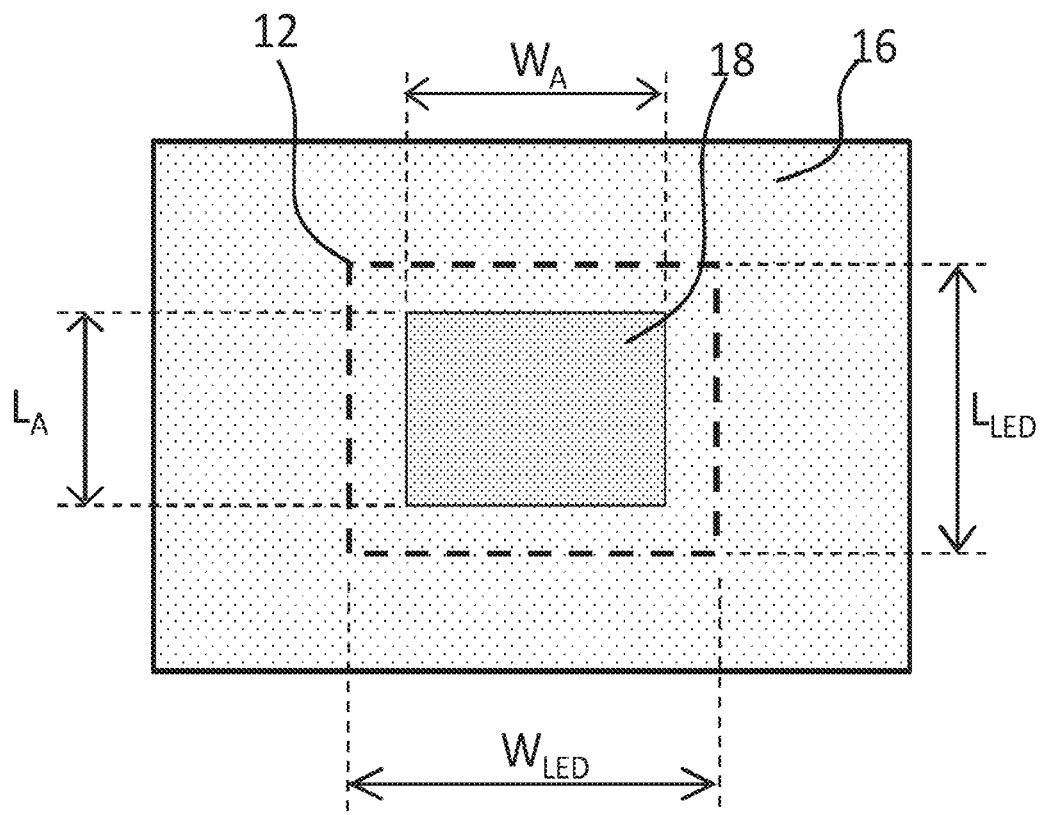
FIG. 1B is a plan view of the known LED light source of FIG. 1A.

The LED-based light sources are similar to that shown in FIGS. 1A and 1B in that they each comprise an LED 12 (on a die substrate 14) within a mix box 16 having an aperture 18 (or light output section 18) of smaller area than the LED 12. As has already been detailed in the background section above, such LED-based light sources exhibit increased luminance and so may be referred to as "high-luminance LED light sources."

As shown in FIG. 2A, each LED light source has one end of an optical fibre 20 positioned to cover its light output section 18. In this way, light from each LED is output from its respective light output section 18 and inputted into the associated optical fibre. The inputted light is transmitted along the optical fibre 20 and output from the other end 22 (i.e. light exit section 22) of the optical fibre 20.

Thus, it will be understood the each optical fibre 20 collects light outputted from a respective LED light source and confines the light by total internal reflection so that the light is reflected towards the light exit section 22 at the other end of the optical fibre 22.

As illustrated in FIG. 2A, the optical fibres 20 are flexible or can be shaped so as to enable the light exit sections 22 to be oriented in a different direction from the light output section 18. Light from the LED light sources can therefore be transmitted along the optical fibres 20 and output from the optical fibres 20 at a different position and/or direction (which may be closer to a desired light exit plane and/or position, for example).

As depicted in FIG. 2B, the LED-based light sources 10 are arranged in a 2-dimensional array so that they are spaced apart from each other by a predetermined separation distance $S_{LED}$. As a result, the total surface space or area $A_{LEDS}$ occupied by the LED-based light sources 10, i.e. the footprint area $A_{LEDS}$ of the LED-based light sources 10, comprises the entire area encompassing the LED light sources 10 and the spaces therebetween. Put another way, the footprint area $A_{LEDS}$ of the LED-based light sources 10 equals the total width $W_{LEDS}$ occupied by the LED-based light sources (and the spaces therebetween) multiplied by the total length $L_{LEDS}$ occupied by the LED-based light sources (and the spaces therebetween), which can be represented by the equation $A_{LEDS}=W_{LEDS} \times L_{LEDS}$.

Conversely, as depicted in FIG. 2C, the light exit sections 22 of the optical fibres 20 are closely packed together so that there is little to no separation between adjacent light exit sections 22. As a result, the total space or area $A_{OUT}$ occupied by the light exit sections 22, i.e. the footprint area $A_{OUT}$ of the light exit sections 22, is less than the footprint area $A_{LEDS}$ of the LED-based light sources 10. Put another way, the total area $A_{OUT}$ of the light exit sections 22 equals the total width $W_{OUT}$ occupied by the light exit sections 22 (and any spaces therebetween) multiplied by the total length $L_{OUT}$ occupied by the light exit sections 22 (and any spaces therebetween), which can be represented by the equation $A_{OUT}=W_{OUT} \times L_{OUT}$, and $A_{OUT}<A_{LEDS}$.

It will therefore be understood that the plurality of optical fibres 20 provide a reduction in the size of the light exit/emitting surface of the light source when compared to the space/area that is taken up by the LED light sources 10. Also, the ability for the space required by the LED lights sources 10 to be larger than that required by the light exit/emitting surface (i.e. the light exit sections 22) can enable the use of more powerful LED light sources and/or greater spacing between the LED light sources.

The embodiment depicted in FIG. 2 thus provides a high-luminance light source comprising a plurality of high-luminance LED light sources 10 that output light into an optically transmissive structure (formed from a plurality of optical fibres 20) which confines the light and then outputs it via a light exit/emitting surface of smaller area than the footprint area of the LED light sources 10. Also, the optical fibres 20 of the optical element can be adapted to redirect the light from the LED light sources 10 so that the light output direction/orientation and/or position is changed or designed to enable tiling with other light sources.

Turning now to FIG. 3, there is depicted a light source according to an embodiment of the invention. More specifically, FIG. 3A is a side elevation of four LED-based light sources of the light source, wherein the LED-based light sources are arranged in a spaced apart arrangement. FIG. 3B depicts the arrangement of the LED-light sources when viewed from above (i.e. in plan view). FIG. 3C depicts the light exit sections of the optically transmissive structure, wherein the optically transmissive structure comprises a plurality of optical collimators, and wherein the light exit sections of the optical collimators are closely packed together.

The LED-based light sources are similar to that shown in FIGS. 1A and 1B in that they each comprise an LED 12 (on a die substrate 14) within a mix box 16 having an aperture 18 (or light output section 18) of smaller area than the LED 12. However, in this embodiment, the light output section 18 of each LED-based light source comprises an optical enhancement material. More specifically, the optical enhancement material 18 comprises a 'colour conversion fill', such as a luminous ceramic material or phosphorescent material. This may further help to maintain the etendue of the lateral emission area.

As shown in FIG. 3A, each LED light source has one end of a respective optical collimator 30 positioned to cover its light output section 18. In this way, light from each LED is output from its respective light output section 18 and inputted into the associated optical collimator 30. The inputted light is transmitted along the optical collimator 30 and output from the other end 32 (i.e. light exit section 32) of the optical collimator 30.

Thus, it will be understood that each optical collimator 30 collects light outputted from a respective LED light source and confines the light by total internal reflection so that the light is reflected towards the light exit section 32 at the other end of the optical collimator 30

As illustrated in FIG. 3A, the optical collimators 30 are bent (e.g. non-linear along their entire length) so as to enable the light exit sections 32 of optical collimators 30 to be laterally offset from the light output sections 18. Light from the LED light sources can therefore be transmitted along the optical collimators 30 and output from the light exit sections 32 at a different lateral position and/or direction (which may be closer to a desired light exit plane and/or position, for example).

As depicted in FIG. 3B, the LEDs 12 are arranged in a 2-dimensional array so that they are spaced apart from each other by a predetermined separation distance $S_{LED}$. As a result, the total surface space or area $A_{LEDS}$ occupied by the LEDs 12, i.e. the footprint area $A_{LEDS}$ of the LEDs 12, comprises the entire area encompassing the LEDS and the spaces therebetween. Put another way, the footprint area $A_{LEDS}$ of the LEDs 12 equals the total width $W_{LEDS}$ occupied by the LEDS (and the spaces therebetween) multiplied by the total length $L_{LEDS}$ occupied by the LEDS (and the spaces therebetween), which can be represented by the equation $A_{LEDS}=W_{LEDS} \times L_{LEDS}$.

Conversely, as depicted in FIG. 3C, the light exit sections 32 of the optical collimators 30 are closely packed together so that there is only a small separation distance $S_{OUT}$ between adjacent light exit sections 32. As a result, the total space or area $A_{OUT}$ occupied by the light exit sections 32, i.e. the footprint area $A_{OUT}$ of the light exit sections 32, is less than the footprint area $A_{LEDS}$ of the LEDS 10. Put another way, the total area $A_{OUT}$ of the light exit sections 32 equals the total width $W_{OUT}$ occupied by the light exit sections 32 (and the spaces therebetween) multiplied by the total length $L_{OUT}$ occupied by the light exit sections 32 (and the spaces therebetween), which can be represented by the equation $A_{OUT}=W_{OUT} \times L_{OUT}$, and $A_{OUT}<A_{LEDS}$.

It will therefore be understood that the arrangement of the plurality of optical collimators 30 provide a reduction in the size of the light exit/emitting surface of the light source when compared to the space/area that is occupied by the LEDs. The ability for the space required by the LEDs to be larger than that required by the light exit/emitting surface (i.e. the light exit sections 32) can enable the use of more powerful LEDs and/or greater spacing between the LEDs.

The embodiment depicted in FIG. 3 thus provides a high-luminance light source comprising a plurality of high-luminance LED light sources 10 that output light into an optically transmissive structure (formed from a plurality of optical collimators 30) which confines the light and then outputs it via a light exit/emitting surface of smaller area than the footprint area of the LED light sources 10. Also, the optical collimators 30 of the optically transmissive structure redirect the light from the LED light sources 10 so that the light output position is changed or designed to enable tiling with other light sources.

Turning now to FIG. 4, there is depicted a light source according to yet another embodiment of the invention. More specifically, FIG. 4A is a side elevation of four LED-based light sources of the light source, wherein the LED-based light sources are arranged in a spaced apart arrangement. FIG. 4B depicts the arrangement of the LED-light sources when viewed from above (i.e. in plan view). FIG. 4C depicts the light exit section of the optically transmissive structure, wherein the optically transmissive structure comprises a trapezium-shaped light guide.

The light source is similar to that of FIG. 3. However, there are two notable modifications which are: (i) a Fresnel structure 40 is adapted to cover/overlap the light output section 18 of each LED light sources 10; and (ii) the optically transmissive structure comprises a single trapezium-shaped light guide 50.

In more detail, a first side 55 of the parallel sides of the light guide is 50 is arranged to face downwardly and cover the light output sections 18 of the LED light sources 10. In this way, light from each LED is output from its respective light output section 18 and inputted into the light guide via the first, downwardly facing side 55 of the light guide 50. The inputted light is transmitted through the light guide 50 and output through the opposite, upwardly facing side 60 of the light guide 50. Thus, the upwardly facing side 60 of the light guide 50 may be referred to as being the light exit surface 60 of the light guide 50.

Thus, it will be understood the light guide 50 collects light outputted from the LED light sources that it covers and confines the light by total internal reflection so that the light is reflected towards the light exit surface 60 at the opposite side of the light guide 50.

As depicted in FIG. 4B, the LEDs 12 are arranged in a 2-dimensional array so that they are spaced apart from each other by a predetermined separation distance $S_{LED}$. Thus, the total surface area $A_{LEDS}$ occupied by the LEDs 12, i.e. the footprint area $A_{LEDS}$ of the LEDs 12, comprises the entire area encompassing the LEDS and the spaces therebetween. Put another way, the footprint area $A_{LEDS}$ of the LEDs 12 equals the total width $W_{LEDS}$ occupied by the LEDS (and the spaces therebetween) multiplied by the total length $L_{LEDS}$ occupied by the LEDS (and the spaces therebetween), which can be represented by the equation $A_{LEDS}=W_{LEDS}\times L_{LEDS}$.

Conversely, as depicted in FIG. 4C, the light exit surface 60 of the light guide 50 has a total area less than the footprint area $A_{LEDS}$ of the LEDS. Put another way, the total area $A_{OUT}$ of the light exit surface 60 equals the total width $W_{OUT}$ of the light exit surface 60 multiplied by the total length $L_{OUT}$ of the light exit surface 60, which can be represented by the equation $A_{OUT}=W_{OUT}\times L_{OUT}$, and $A_{OUT}<A_{LEDS}$.

It will therefore be understood that the light guide 50 provides a reduction in the size of the light exit/emitting surface of the light source when compared to the space/area that is occupied by the LEDS.

The embodiment depicted in FIG. 4 thus provides a high-luminance light source comprising a plurality of high-luminance LED light sources 10 that output light into an optical element which confines the light and then outputs it via a light exit/emitting surface of smaller area than the footprint area of the LED light sources.

Also, it will be appreciated that it is preferable to arrange the embodiment of FIG. 4 to include micro-optics on top of the LEDS which re-direct the light towards the light exit surface 60 of the light guide 50, ideally with as little optical loss as possible. If the light is not re-directed then some light may escape at the edges of the trapezium-shaped light guide 50 (where no total internal reflection occurs for certain angles of incidence). Such micro-optics could be asymmetric prism foils (like for a conventional flash) that can direct light to another angle away from the normal.

Figure 5:
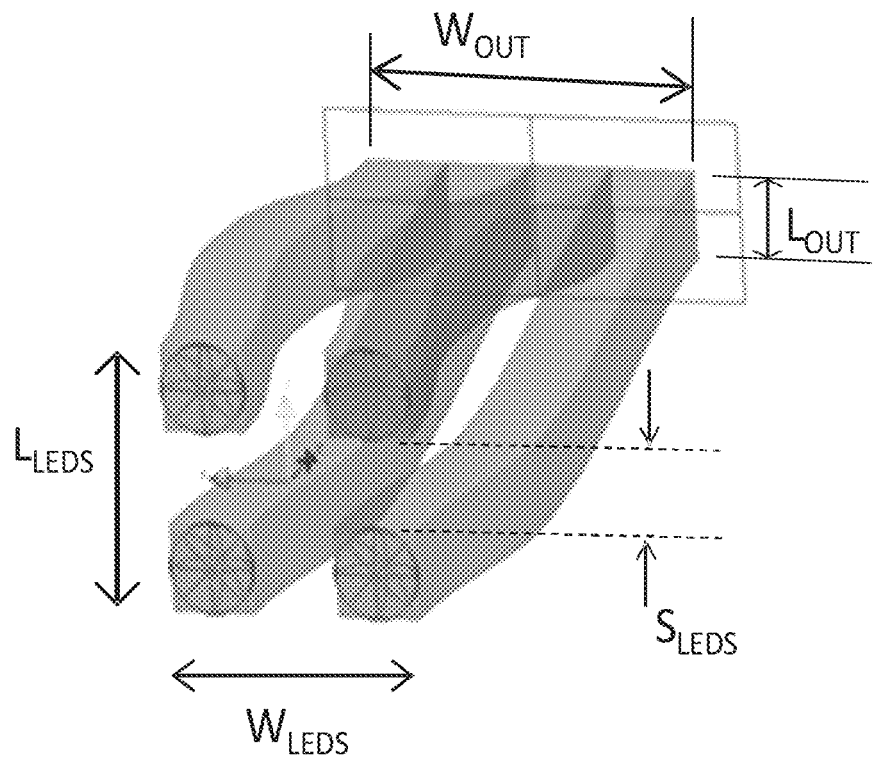
FIG. 5 depicts an arrangement of an optically transmissive structure of a light source according to an embodiment.
Figure 6:
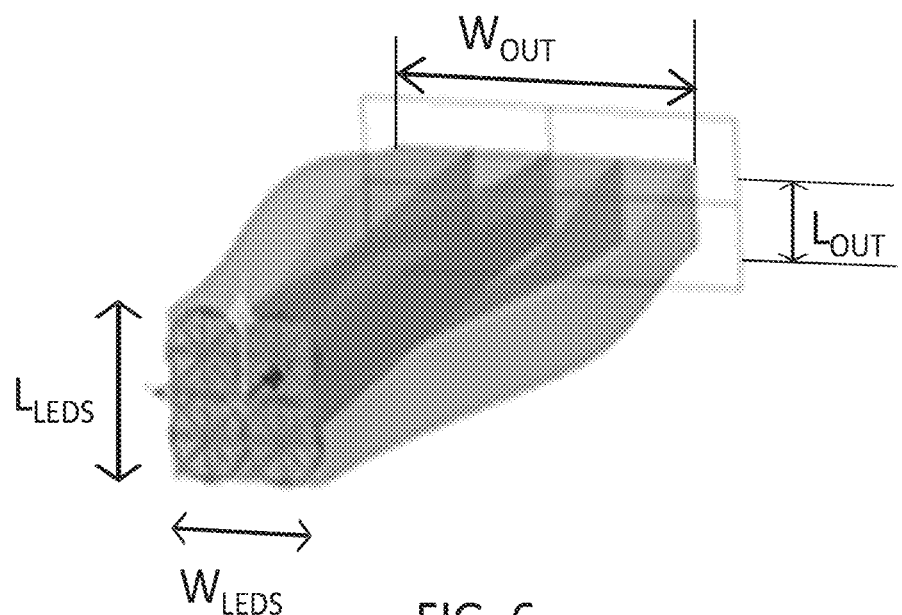
FIG. 6 depicts an arrangement of an optically transmissive structure of a light source according to another embodiment.

Referring now to FIGS. 5 and 6, there are depicted first and second potential arrangements of an optically transmissive structure, respectively.

In FIG. 5, the optically transmissive structure comprises four waveguides 100, each waveguide covering the light output section of a respective LED light source 110 at one end. The four LED light sources are arranged in a 2×2 array. The waveguides 100 are shaped (e.g bent) such that their other ends (i.e. their light exit ends) are spaced apart and arranged in 1×4 array, i.e. in a single line or row.

The total surface area $A_{LEDS}$ occupied by the LED light sources 110, i.e. the footprint area $A_{LEDS}$ of the LED light sources 110 equals the total width $W_{LEDS}$ occupied by the LED light sources 110 multiplied by the total length $L_{LEDS}$ occupied by the LED light sources 110, which can be represented by the equation $A_{LEDS}=W_{LEDS}\times L_{LEDS}$.

As a result of the arrangement of the waveguides 100, the total space or area $A_{OUT}$ occupied by the light exit ends, i.e. the footprint area $A_{OUT}$ of the light exit ends, is less than the footprint area $A_{LEDS}$ of the LED light sources 110. Put another way, the total area $A_{OUT}$ of the light exit ends equals the total width $W_{OUT}$ occupied by the light exit ends (and the spaces therebetween) multiplied by the total length $L_{OUT}$ occupied by the light exit ends (and the spaces therebetween), which can be represented by the equation $A_{OUT}=W_{OUT}\times L_{OUT}$, and $A_{OUT}<A_{LEDS}$.

Similarly, in FIG. 6, the optically transmissive structure again comprises four waveguides 100, each waveguide covering the light output section of a respective LED light source 110 at one end. The four LED light sources are arranged in a 2×2 array, and the waveguides 100 are shaped (e.g bent) such that their other ends (i.e. their light exit ends) are closely packed together in 4×1 array, i.e in a single line or row. In this way, there is little to no separation between adjacent light exit ends of the waveguides 100.

The total surface area $A_{LEDS}$ occupied by the LED light sources 110, i.e. the footprint area $A_{LEDS}$ of the LED light sources 110 equals the total width $W_{LEDS}$ occupied by the LED light sources 110 multiplied by the total length $L_{LEDS}$ occupied by the LED light sources 110, which can be represented by the equation $A_{LEDS}=W_{LEDS}\times L_{LEDS}$.

However, as depicted in FIG. 6, the total space or area $A_{OUT}$ occupied by the light exit ends, i.e. the footprint area $A_{OUT}$ of the light exit ends, is equal to or less than the footprint area $A_{LEDS}$ of the LED light sources 110. Put another way, the total area $A_{OUT}$ of the light exit ends equals the total width $W_{OUT}$ occupied by the light exit ends (and the spaces therebetween) multiplied by the total length $L_{OUT}$ occupied by the light exit ends (and the spaces therebetween), which can be represented by the equation $A_{OUT}=W_{OUT}\times L_{OUT}$, and $A_{OUT}\leq A_{LEDS}$.

The arrangements of FIGS. 5 and 6 enable re-shaping of the original light source arrangement. Also, it is noted that the four LEDS as illustrated in FIG. 6 could in fact be one, larger LED. And thus the arrangement of FIG. 6 enables reshaping of a single light source.

It will be understood that other re-shaping arrangements may be employed. For example, a 4×4 LED array could be transformed in a 2×8 array of light emitting surfaces (or any other arbitrary shape).

Those skilled in the art will understand that other variations to the disclosed embodiments can be understood and effected.

For example, the LED light sources of the present disclosure may be any type of LED, such as a Flip Chip type (Thin Film Flip Chip), Patterned Sapphire Substrate, top connected/top emission, top-bottom connected. Also, the light source could be used as naked die, or packaged.

A light output section (or light emission area) of an LED light source refers to an area towards or through which light from the LED is output (or emitted). A cavity or cavities of a LED light source may thus extend towards the light output section. The light output section may for example be an area of the growth substrate, such as sapphire. Also, the light output direction is generalised to be in a single direction (e.g. vertical in the Figures) along which light is output from the light output section. However, it will be understood that not all light output from a light output section may be output exactly along the output direction. Thus, the light output direction should be understood to refer to the general direction along which light is output from a light output section, extending away from the surface of the light output section for example.

The light source may further comprise a layer of optical enhancement material at least partially covering the light output/exit section(s) of the optically transmissive structure.

Further, if an embodiment comprises a plurality of cavities, some or all of the cavities may comprise (e.g. be filled with) different materials. As an example, certain cavities may be filled with a first type of phosphor (e.g. converting blue to white) and other cavities may be filled with another type of phosphor (e.g. converting blue to red).

Embodiments may be employed in the field of automotive lighting and other fields/applications where high-luminance lighting is desirable.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A light source, comprising:
a plurality of LED light sources including at least four LED light sources arranged in a 2-dimensional array on a planar area, each of the plurality of LED light sources comprising:
a semiconductor diode structure adapted to generate light;
a light output section above the semiconductor diode structure adapted to output light from the semiconductor diode structure; and
a light reflecting structure abutting at least a portion of side surfaces of the semiconductor diode structure and adapted to reflect light from the semiconductor diode structure towards the light output section, the light reflecting structure having an aperture formed over the light output section of the semiconductor diode structure, the aperture having an area that is less than an area of the semiconductor diode structure; and
an optically transmissive structure overlapping the light output sections of the plurality of LED light sources so as to receive light from the light output sections of the plurality of LED light sources, the optically transmissive structure having a light exit section adapted to output the received light, wherein the area of the light exit section of the optically transmissive structure is less than a footprint area of the plurality of LED light sources, the optically transmissive structure further comprising one or more optical collimators covering the apertures.

2. The light source of claim 1, wherein the optically transmissive structure is adapted to confine received light by total internal reflection and thus reflect received light towards the light exit section.

3. The light source of claim 1, wherein the optically transmissive structure comprises a plurality of optical fibres positioned on top of the light output sections of the plurality of LED light sources.

4. The light source of claim 1, wherein the aperture formed in at least one of the light reflecting structures contains an optical enhancement material.

5. The light source of claim 1, wherein the light output section of at least one of the plurality of LED light sources comprises an optical enhancement material.

6. The light source of claim 1, further comprising a layer of optical enhancement material at least partially covering the light exit section of the optically transmissive structure.

7. The light source of claim 1, wherein the optically transmissive structure comprises a trapezium-shaped light guide at least partially overlapping the light output sections of the plurality of LED light sources.

8. The light source of claim 7, wherein each of the plurality of LED light sources further comprises a Fresnel structure.

9. An automotive light comprising a light source according to claim 1.

10. A projector light comprising a light source according to claim 1.

11. The light source of claim 1, wherein the optically transmissive structure comprises multiple optical collimators with their light exit sections arranged in a 1-dimensional array.

12. A method of manufacturing a light source comprising a plurality of LED light sources including at least four LED light sources, each of the plurality of LED light sources having:
a semiconductor diode structure adapted to generate light; and
a light output section above the semiconductor diode structure adapted to output light from the semiconductor diode structure, the light output section having an area smaller than an area of the semiconductor diode structure, the method comprising the step of:
providing each of the plurality of LED light sources with a light reflecting structure abutting at least a portion of side surfaces of the semiconductor diode structure and adapted to reflect light from the semiconductor diode structure towards the light output section, the light reflecting structure including an aperture over the light output section of the semiconductor diode structure,
arranging the plurality of LED light sources in a 2-dimensional array on a planar area,
providing an optically transmissive structure overlapping the light output sections of the plurality of LED light sources so as to receive light from the light output sections of the plurality of LED light sources, the optically transmissive structure having a light exit section adapted to output the received light,
wherein the area of the light exit section of the optically transmissive structure is less than a footprint area of the plurality of LED light sources, and
wherein the optically transmissive structure comprises one or more optical collimators covering the apertures.

13. The method of claim 12, wherein the optically transmissive structure is adapted to confine received light by total internal reflection and thus reflect received light towards the light exit section.

14. The method of claim 13, wherein the step of providing the optically transmissive structure comprises positioning a plurality of optical fibres on top of the light output sections of the plurality of LED light sources.

15. The method of claim 13, wherein the step of providing the optically transmissive structure comprises positioning a trapezium-shaped light guide on top of the light output sections of the plurality of LED light sources.

16. The method of claim 12, wherein the aperture in at least one of the light reflecting structures contains an optical enhancement material.

17. The method of claim 12, wherein the light output section of at least one of the plurality of LED light sources comprises an optical enhancement material.

18. The method of claim 12, further comprising providing a layer of optical enhancement material at least partially covering the light exit section of the optically transmissive structure.

* * * * *